United States Patent
Ota et al.

(10) Patent No.: US 8,823,148 B2
(45) Date of Patent: Sep. 2, 2014

(54) DIODE WITH EPITAXIALLY GROWN SEMICONDUCTOR LAYERS

(75) Inventors: Chiharu Ota, Kanagawa (JP); Takashi Shinohe, Kanagawa (JP); Makoto Mizukami, Kanagawa (JP); Johji Nishio, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 674 days.

(21) Appl. No.: 13/034,297

(22) Filed: Feb. 24, 2011

(65) Prior Publication Data

US 2012/0056196 A1   Mar. 8, 2012

(30) Foreign Application Priority Data

Sep. 7, 2010   (JP) .................................. 2010-199982

(51) Int. Cl.
| | |
|---|---|
| *H01L 29/868* | (2006.01) |
| *H01L 29/861* | (2006.01) |
| *H01L 29/66* | (2006.01) |
| *H01L 29/872* | (2006.01) |
| *H01L 29/16* | (2006.01) |

(52) U.S. Cl.
CPC ............ *H01L 29/872* (2013.01); *H01L 29/861* (2013.01); *H01L 29/66143* (2013.01); *H01L 29/66136* (2013.01); *H01L 29/1608* (2013.01)
USPC ............. 257/656; 257/77; 257/485; 257/622; 257/E29.336

(58) Field of Classification Search
USPC .................................................... 257/77, 656
See application file for complete search history.

(56) References Cited

U.S. PATENT DOCUMENTS 7,274,083 B1 *  9/2007  Sankin et al. .................. 257/471
2005/0045982 A1 *  3/2005  Shenai .......................... 257/481

FOREIGN PATENT DOCUMENTS

JP         2009-535853         10/2009

* cited by examiner

*Primary Examiner* — Jerome Jackson, Jr.
(74) *Attorney, Agent, or Firm* — Oblon, Spivak, McClelland, Maier & Neustadt, L.L.P.

(57) ABSTRACT

A semiconductor device includes a first-conductivity-type semiconductor substrate; a first-conductivity-type first semiconductor layer formed on the semiconductor substrate, and having an impurity concentration lower than that of the semiconductor substrate; a second-conductivity-type second semiconductor layer epitaxially formed on the first semiconductor layer; a second-conductivity-type third semiconductor layer epitaxially formed on the second semiconductor layer, and having an impurity concentration higher than that of the second semiconductor layer; a recess formed in the third semiconductor layer, at least a corner portion of a side face and a bottom surface of the recess being located in the second semiconductor layer; a first electrode in contact with the third semiconductor layer; a second electrode connected to the first electrode and in contact with the second semiconductor layer at the bottom surface of the recess; and a third electrode in contact with a lower surface of the semiconductor substrate.

9 Claims, 6 Drawing Sheets

DIODE WITH EPITAXIALLY GROWN SEMICONDUCTOR LAYERS

CROSS-REFERENCE TO RELATED APPLICATION

This application is based upon and claims the benefit of priority from Japanese Patent Application No. 2010-199982, filed on Sep. 7, 2010, the entire contents of which are incorporated herein by reference.

FIELD

Embodiments described herein relate generally to a semiconductor device and a manufacturing method thereof.

BACKGROUND

In a semiconductor rectifying device that rectifies an input current to output the rectified current, there are a PiN diode having a pn junction and a Schottky barrier diode (SBD) having a carrier potential barrier of a difference in work function between a semiconductor layer and metal. In the Schottky barrier diode, there is a JBS (Junction Barrier Schottky barrier diode) in which an impurity region (for example, p type) having a conductive type different from that of the semiconductor layer (for example, n type) is disposed in a surface of the semiconductor layer in order to relax an electric field applied to an interface between the semiconductor layer and the metal. There is also an MPS (Merged PiN-diode Schottky-diode), in which the contact between the impurity region (for example, p type) and the metal of the JBS is set to or brought close to ohmic connection, and a minority carrier is injected to decrease a resistance by conductivity modulation when a voltage exceeding a built-in potential (Vbi) between the impurity region and the semiconductor layer is applied.

On the other hand, a wide bandgap semiconductor such as silicon carbide (hereinafter also referred to as SiC) is expected as a next-generation power semiconductor device. The wide bandgap semiconductor has a wide bandgap, high breakdown field strength, and high thermal conductivity compared with Si. A low-loss power semiconductor device that can be operated at high temperature can be implemented using the characteristics of the wide bandgap semiconductor.

In the MPS, generally the impurity region is formed by ion implantation of an impurity. However, ion implantation damage exists in the high-concentration impurity region formed by the ion implantation. Therefore, unfortunately an on-voltage of the semiconductor rectifying device is increased, and hole injection is delayed to increase a switching loss when an off-state is switched to an on-state.

DETAILED DESCRIPTION

Hereinafter, an embodiment will be described with reference to the drawings.

A semiconductor device according to an embodiment includes a first-conductivity-type semiconductor substrate; a first-conductivity-type first semiconductor layer that is formed on an upper surface (one surface) of the semiconductor substrate, and has an impurity concentration lower than that of the semiconductor substrate; a second-conductivity-type second semiconductor layer that is epitaxially formed on the first semiconductor layer; and a second-conductivity-type third semiconductor layer that is epitaxially formed on the second semiconductor layer, and has an impurity concentration higher than that of the second semiconductor layer. The semiconductor device also includes a recess that is formed in the third semiconductor layer, and at least a corner portion of a side face and a bottom surface is located in the second semiconductor layer. The semiconductor device also includes a first electrode that is in contact with the third semiconductor layer; a second electrode that is connected to the first electrode while being in contact with the second semiconductor layer at the bottom surface of the recess; and a third electrode that is in contact with a lower surface (the other surface) of the semiconductor substrate.

In the semiconductor device of the embodiment, the impurity region is formed not by the ion implantation but by the epitaxial growth, so that the loss caused by the ion implantation damage can be suppressed. Additionally, breakdown voltage degradation caused by an electric field concentration can be suppressed by providing the second semiconductor layer in at least the corner portion in the bottom surface of the recess.

The MPS, in which the semiconductor substrate and the first, second, and third semiconductor layers are made of silicon carbide (SiC), the first conductivity type is the n type and the second conductivity type is the p type, will be described below by way of example.

Figure 1:
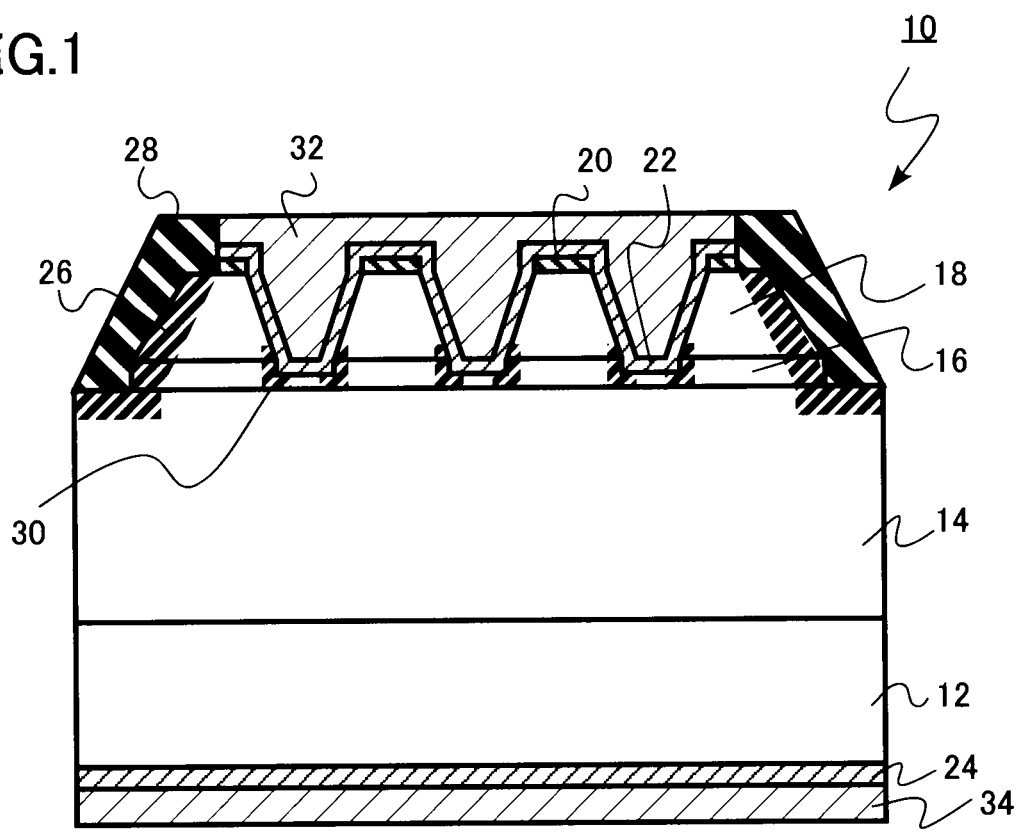
FIG. 1 is a sectional view of a semiconductor device according to an embodiment.

FIG. 1 is a sectional view of the semiconductor device of the embodiment.

As illustrated in FIG. 1, in an MPS 10 that is the semiconductor device of the embodiment, for example, an n type SiC layer (first semiconductor layer, hereinafter also referred to as n−type SiC layer) 14 is epitaxially formed as a drift layer on an upper surface (one surface) of an n type hexagonal 4H-SiC substrate 12. For example, the SiC substrate 12 and the n-type SiC layer 14 contain N (nitrogen) as an impurity.

The n-type SiC layer 14 has an impurity concentration lower than that of the SiC substrate 12. For example, the n+ type SiC substrate 12 is a low-resistance substrate having the impurity concentration of 1E+18 to 1E+20 atoms/cm$^3$. For example, the n-type SiC layer 14 has the impurity concentration of 8E+14 atoms/cm$^3$ to 1E+17 atoms/cm$^3$ and a thickness of 5 μm to 100 μm.

A p type SiC layer (second semiconductor layer, hereinafter also referred to as p-type SiC layer) 16 is epitaxially formed on the n-type SiC layer 14. For example, the p-type SiC layer 16 has the thickness of 0.1 to 2.0 μm.

A p type SiC layer (third semiconductor layer, hereinafter also referred to as p+type SiC layer) 18 is epitaxially formed on the p-type SiC layer 16, and has the impurity concentration higher than that of the p-type SiC layer 16. For example, the p+type SiC layer 18 has the thickness of 1 to 5 μm. From the viewpoint of enhancing hole injection efficiency, desirably the p+type SiC layer 18 has the thickness of 3 μm or more.

For example, the p type impurities of the p-type SiC layer 16 and p+type SiC layer 18 are Al (aluminum) or B (boron).

A recess is formed in the p+type SiC layer 18, and at least a corner portion in which a side face and a bottom surface of the recess intersect each other is located in the p-type SiC layer 16. The n-type SiC layer 14 may be exposed to part of a bottom portion.

A first electrode 20 is provided while being in contact with the upper surface of the p+type SiC layer 18. The p+type SiC layer 18 is in ohmic contact with the first electrode 20. Any material may be used as the first electrode 20 as long as the material is in ohmic contact with the p+type SiC layer 18. For example, the first electrode 20 is made of a metallic material such as Ni, Al, and Ti/Al.

A second electrode 22 is provided in the bottom surface of the recess, and is partially connected to the first electrode 20 while being in contact with the p-type SiC layer 16. The p-type SiC layer 16 is in Schottky contact with the second electrode 22. Any material may be used as the second electrode 22 as long as the material is in Schottky contact with the p-type SiC layer 16. For example, the second electrode 22 is made of a metallic material such as Ti, Ni, Mo, W, and Ta or a silicide thereof.

From the viewpoint of realizing the good ohmic contact with the first electrode 20, desirably the p+type SiC layer 18 has the impurity concentration of about 1E18 to about 1E21 atoms/cm$^3$.

From the viewpoint of realizing the good Schottky contact with the second electrode 22, desirably the p-type SiC layer 16 is higher than the n-type SiC layer 14 in the impurity concentration by 0.5 to 1 order of magnitude and has the impurity concentration of 5E+17 atoms/cm$^3$ or less.

A third electrode 24 is provided while being in contact with a lower surface (the other surface) of the SiC substrate 12. The SiC substrate 12 is in ohmic contact with the third electrode 24. Any material may be used as the third electrode 24 as long as the material is in ohmic contact with the SiC substrate 12. For example, the third electrode 24 is made of a metallic material such as Ni, Al, and Ti/Al.

An end portion of the element of the MPS 10 is formed into a mesa shape as the breakdown voltage structure, and a first high-resistance region 26 and an insulating film 28 are provided. The insulating film 28 such as a silicon oxide film is provided on the first high-resistance region 26.

As illustrated in FIG. 1, a second high-resistance region 30 whose resistance is higher than that of the n-type SiC layer 14 may desirably be provided in the p-type SiC layer 16 near the corner portion of the recess. The second high-resistance region 30 may desirably be provided in the p-type SiC layer 16 including the corner portion of the recess.

A first pad electrode 32 that constitutes an anode electrode is formed on the second electrode 22. For example, the first pad electrode 32 is made of Al when Al wire bonding is performed.

A second pad electrode 34 that constitutes a cathode electrode is formed beneath the third electrode 24. For example, the second pad electrode 34 is made of Ti/Ni/Al when mounting is performed using solder.

In the MPS 10 of the embodiment, when a voltage is applied such that the anode electrode becomes positive with respect to the cathode electrode, electrons that overcome a Schottky barrier of the p-type SiC layer 16 or n-type SiC layer 14 from the second electrode 22 that is the Schottky electrode flow from the anode electrode to the cathode electrode, thereby performing the forward operation. The Schottky barrier between the p-type SiC layer 16 and the second electrode 22 is changed according to the concentration of the p-type SiC layer 16. A Schottky characteristic is exhibited for the low p concentration. A current is passed according to a junction area ratio and the individual Schottky barrier when both the n-type SiC layer 14 and the p-type SiC layer 16 are in Schottky contact with the second electrode 22.

When an ohmic junction between the p+type SiC layer 18 and the first electrode 20 that is the ohmic electrode has a large width, with increasing voltage, holes are injected from the p+type SiC layer 18 to shift the Schottky characteristic to the ohmic characteristic from a certain point. At this point, when the p+type SiC layer 18 is formed by the ion implantation, a carrier life time of the hole is shortened due to the damage layer to degrade injection efficiency.

On the other hand, all of the p+type SiC layer 18, the p-type SiC layer 16, and the n-type SiC layer 14, which are a hole injection pathway, are epitaxially formed in the MPS 10 of the embodiment. Therefore, the original hole life time of SiC can be retained to maintain the high injection efficiency.

When a voltage is applied such that the anode electrode becomes negative with respect to the cathode electrode, because the breakdown voltage of the n-type SiC layer is decreased lower than the original breakdown voltage by a notch or a corner, which is formed by performing an etching treatment to form the recess at least in the p+type SiC layer 18 and the p-type SiC layer 16, possibly the electric field concentration is generated in the notch or the corner region to pass the current through the element.

Therefore, the increase in leakage current or the breakdown voltage degradation, caused by the electric field concentration in the corner portion, can be suppressed by covering the corner of the recess with the p-type SiC layer 16. The electric field concentration is further relaxed in the corner portion by providing the second high-resistance region 30 in the corner portion of the recess, so that the increase in leakage current or the breakdown voltage degradation can be further suppressed.

The breakdown voltage degradation is suppressed by providing the first high-resistance region 26 in the edge portion of the element, so that the high breakdown voltage can be maintained.

In the embodiment, as illustrated in FIG. 1, a side face of the recess desirably has a normally tapered shape. This is because the normally tapered shape further relaxes the electric field concentration in the corner portion.

In performing switching operation, particularly in shifting a backward state to a forward state, a large on-voltage is transiently generated to increase a switching loss when the hole injection from the p+type SiC layer 18 is delayed. On the other hand, the MPS having the small switching loss is completed because all the hole injection pathways are epitaxially formed as described above.

According to the semiconductor device of the embodiment, as described above, because the ion implantation damage does not exist, the increase in switching loss caused by the ion implantation damage is not generated, which allows the low-loss semiconductor device to be implemented. At the same time, the leakage current is decreased, which allows the high-breakdown-voltage semiconductor device to be implemented.

FIGS. 2 to 11 are process sectional views illustrating a method for manufacturing the semiconductor device of the embodiment. The method for manufacturing the semiconductor device of the embodiment will be described below with reference to FIGS. 2 to 11.

Figure 2:
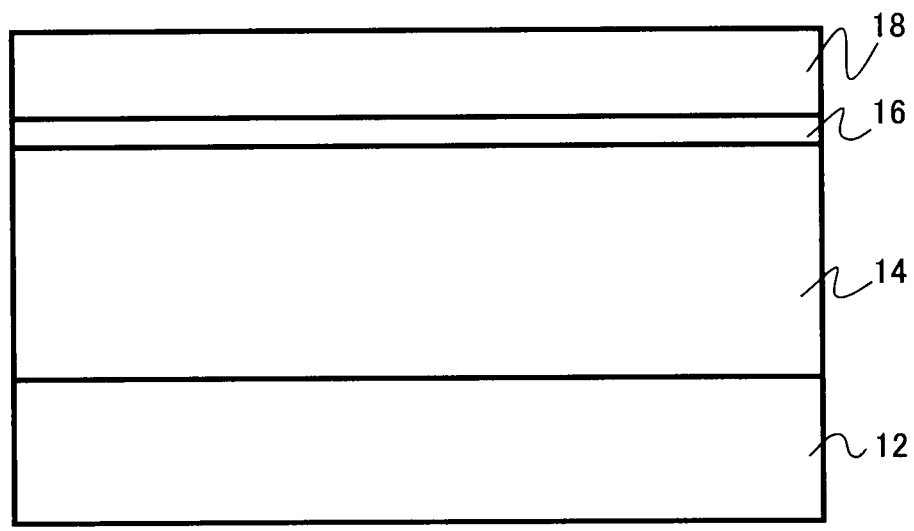
FIG. 2 is a process sectional view illustrating a method for manufacturing the semiconductor device of the embodiment.

A buffer layer (not illustrated) and the n−type SiC layer 14 whose impurity concentration is lower than that of the SiC substrate 12 are epitaxially formed on the bulk SiC substrate 12 prepared by a sublimation method or the like. Then the p−type SiC layer 16 is epitaxially formed on the n−type SiC layer 14. The p+type SiC layer 18 whose impurity concentration is higher than that of the p−type SiC layer 16 is epitaxially formed on the p−type SiC layer 16 (FIG. 2).

Figure 3:
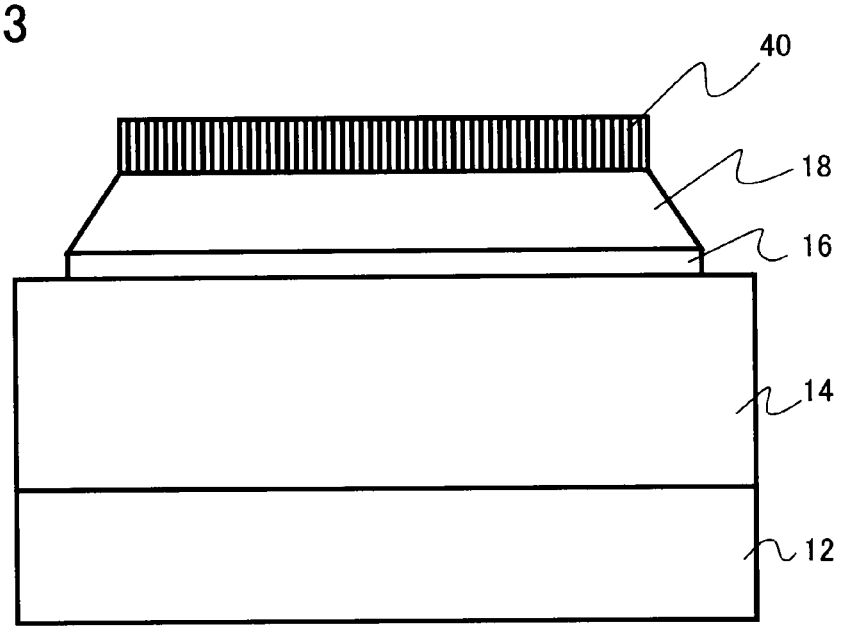
FIG. 3 is a process sectional view illustrating the method for manufacturing the semiconductor device of the embodiment.

Then an etching mask layer 40 is formed to process the mesa-shape portion that is the breakdown voltage structure. In processing the mesa-shape portion, using an F or Cl etching gas, the p+type SiC layer 18 and the p−type SiC layer 16 are etched by ionic etching such as RIE (FIG. 3).

Figure 4:
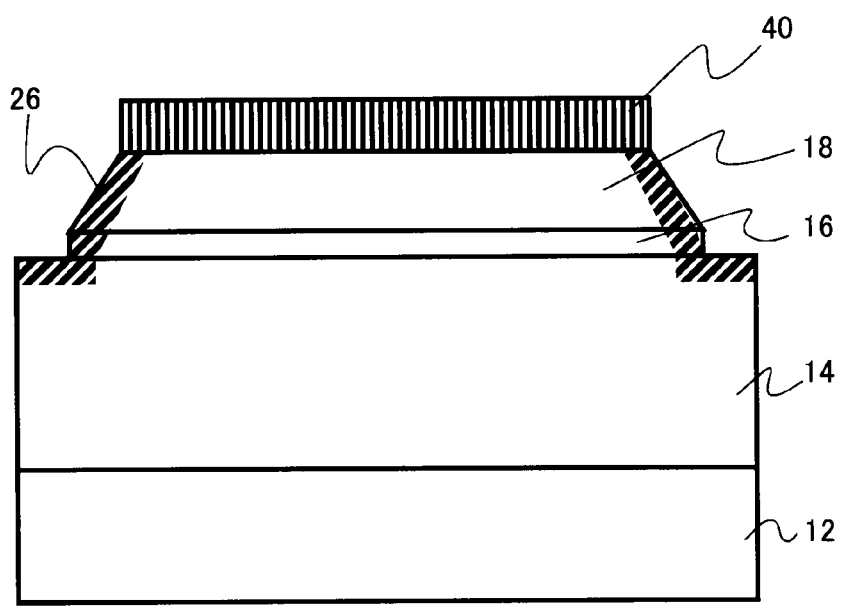
FIG. 4 is a process sectional view illustrating the method for manufacturing the semiconductor device of the embodiment.

Then Ar or B is ion-implanted at room temperature while the mask layer 40 remains. When the remaining thickness of the mask layer 40 becomes small, the ion implantation mask may separately be formed by a resist mask. The first high-resistance region 26 is formed by the ion implantation (FIG. 4).

Figure 5:
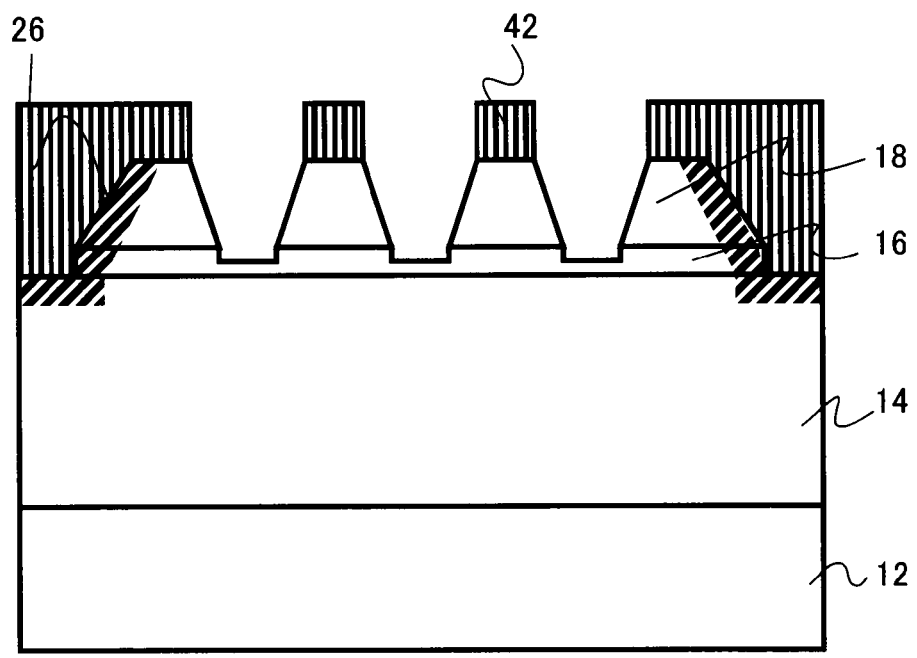
FIG. 5 is a process sectional view illustrating the method for manufacturing the semiconductor device of the embodiment.

Then, a mask layer 42 is formed in order to etch the p+type SiC layer 18 that is the active region, and the recess in which at least the corner portion of the side face and the bottom surface is located in the p−type SiC layer 16 is formed by etching. That is, the etching is performed on the condition that the corner portion or a notch and a sub-trench of the corner portion, which are formed by the etching, are absorbed in the p−type SiC layer 16 (FIG. 5). At this point, desirably the etching is performed such that the side face of the recess has the normally tapered shape.

Figure 6:
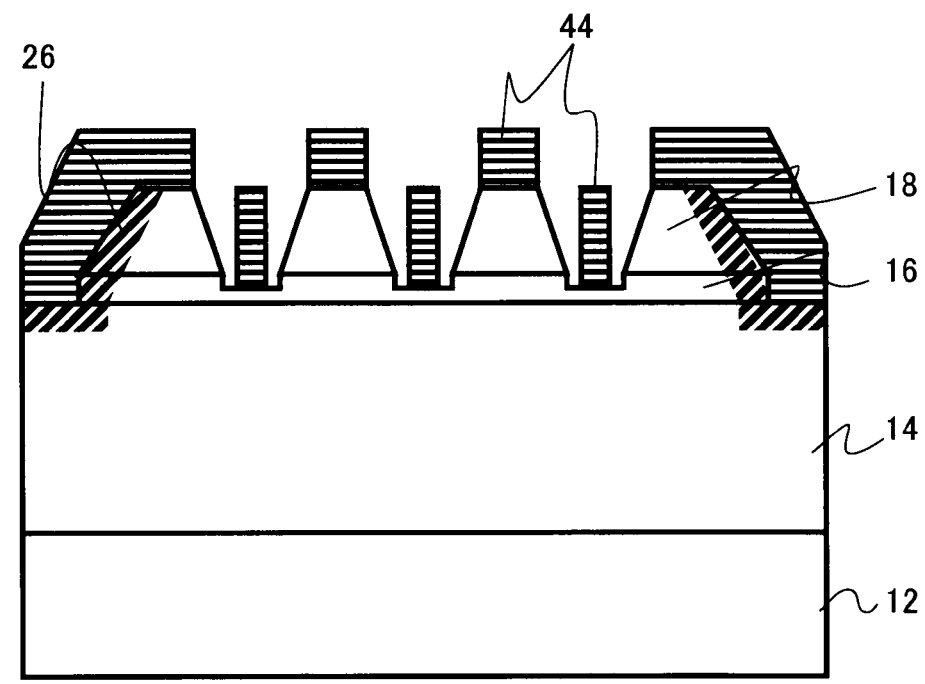
FIG. 6 is a process sectional view illustrating the method for manufacturing the semiconductor device of the embodiment.
Figure 7:
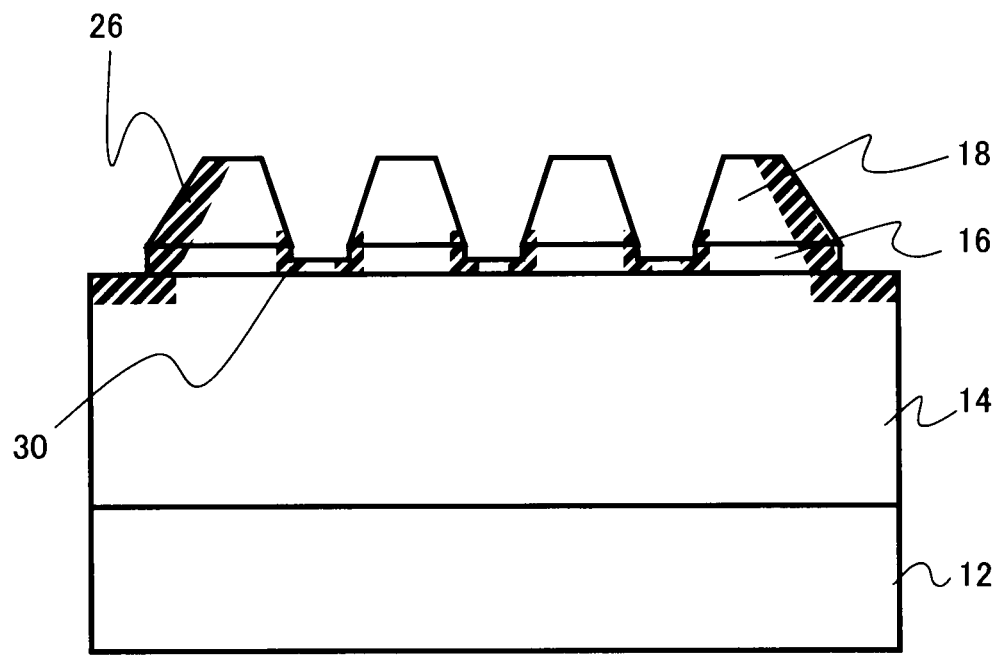
FIG. 7 is a process sectional view illustrating the method for manufacturing the semiconductor device of the embodiment.

Then a mask layer 44 is formed such that the corner portion of the side face and bottom surface of the recess is exposed (FIG. 6). Then Ar or B is selectively ion-implanted into the corner portion at room temperature using the mask layer 44. Then the impurity is activated by a heat treatment at a low temperature of 1200° C. or less to form the second high-resistance region 30 (FIG. 7).

Figure 8:
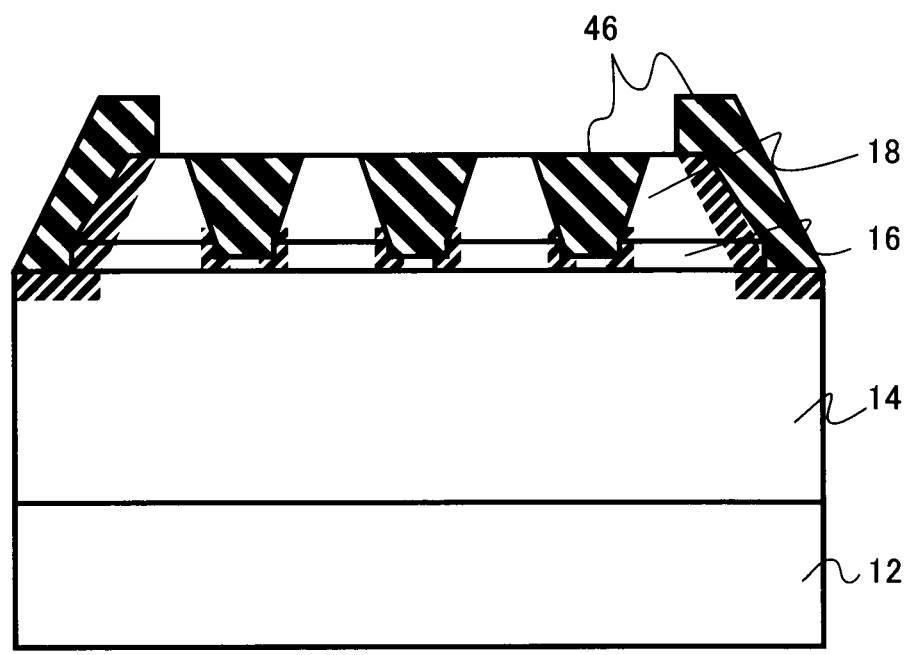
FIG. 8 is a process sectional view illustrating the method for manufacturing the semiconductor device of the embodiment.

Then an insulating film 46 that constitutes a passivation film is formed by oxidation or deposition of a CVD film. Then the upper surface of the p+type SiC layer 18 is partially opened (FIG. 8).

Figure 9:
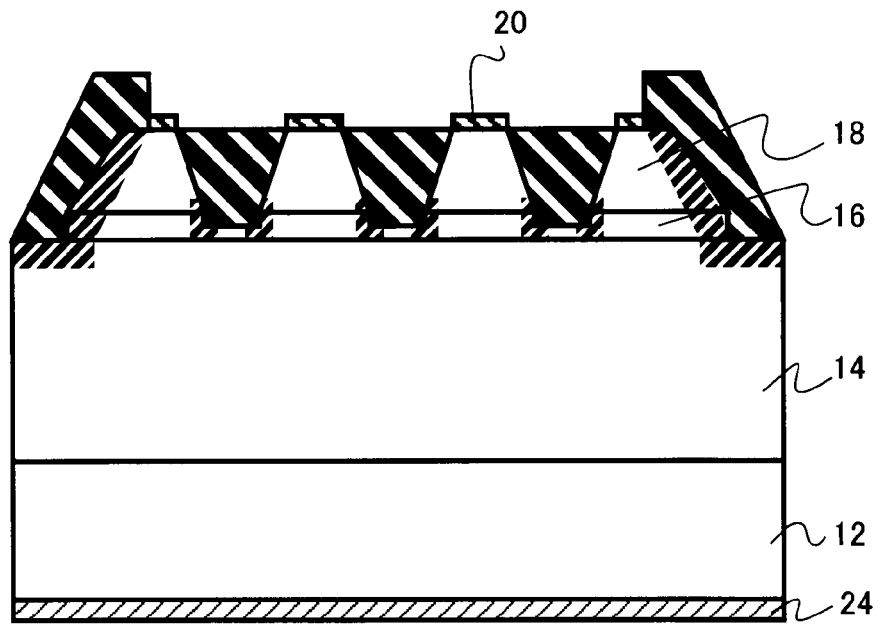
FIG. 9 is a process sectional view illustrating the method for manufacturing the semiconductor device of the embodiment.

The first electrode 20 that constitutes the ohmic electrode is formed in the region opened in the upper surface (one surface) of the p+type SiC layer 18 while being in contact with the p+type SiC layer 18. At this point, the third electrode 24 that constitutes the ohmic electrode is formed in the lower surface (the other surface) of the SiC substrate 12 (FIG. 9).

Then the ohmic junction is completed by a heat treatment at a low temperature of 1050° C. or less.

Figure 10:
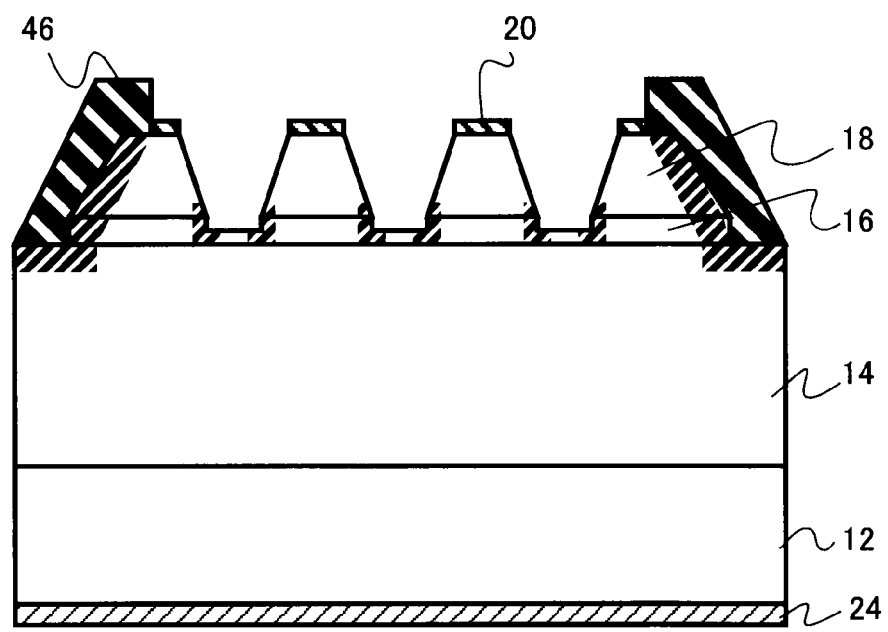
FIG. 10 is a process sectional view illustrating the method for manufacturing the semiconductor device of the embodiment.
Figure 11:
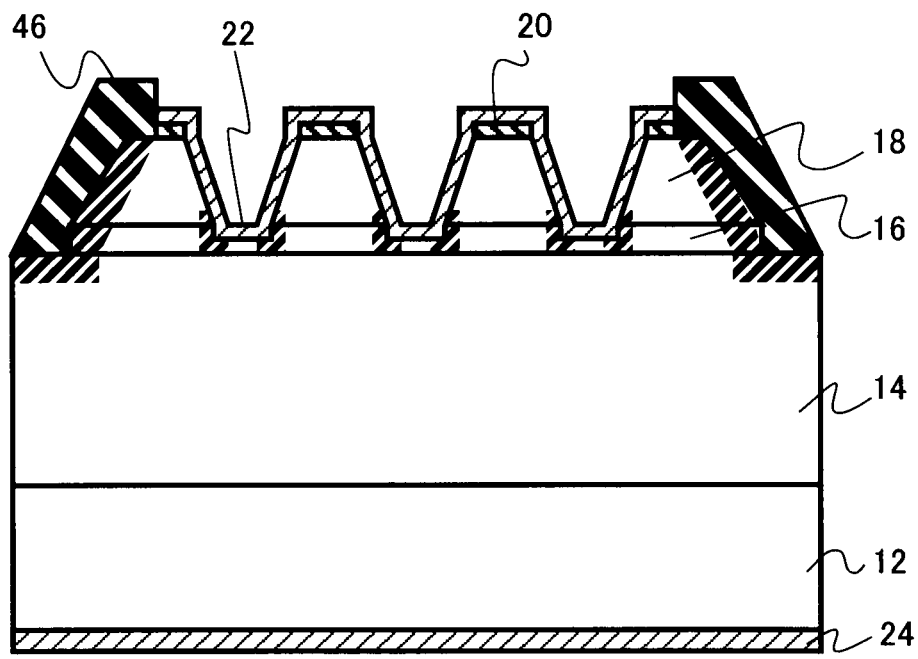
FIG. 11 is a process sectional view illustrating the method for manufacturing the semiconductor device of the embodiment.

Then an insulating film 46 with which the recess is covered is removed (FIG. 10). The second electrode 22 that constitutes the Schottky electrode is formed in the bottom surface of the recess and contacted at the bottom surface. The second electrode 22 is connected to the first electrode 20 while being in contact with the p−type SiC layer 16 or the n−type SiC layer 14 (FIG. 11).

Then, the first pad electrode 32 is formed on the second electrode 22, and the second pad electrode 34 is formed beneath or on the third electrode 24 to produce the MPS 10 of the embodiment illustrated in FIG. 1.

According to the manufacturing method, the low-loss semiconductor device is implemented by epitaxially forming all of the n−type SiC layer 14, the p−type SiC layer 16, and the p+type SiC layer 18. The leakage current is suppressed by providing the p−type SiC layer 16, the first high-resistance region 26, and the second high-resistance region 30, thereby implementing the high-breakdown-voltage semiconductor device. Further, the semiconductor device of the embodiment can be produced through the low-temperature process in which the ion implantation at room temperature and the heat treatment at the temperature of 1200° C. or less are performed similarly to the silicon process. Accordingly, expensive production installations and production process are not required. Therefore, the production cost of the semiconductor device is reduced.

While certain embodiments have been described, these embodiments have been presented by way of example only, and are not intended to limit the scope of the inventions. Indeed, the semiconductor device and the manufacturing method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

In the semiconductor rectifying device of the embodiment, the first conductivity type is the n type and the second conductivity type is the p type by way of example. Alternatively, a semiconductor device in which the first conductivity type is the p type and the second conductivity type is the n type may be used.

In the embodiment, the silicon carbide (SiC) is used as the semiconductor by way of example. Alternatively, the invention may be applied to other semiconductors such as gallium nitride (GaN), silicon (Si), and diamond.

What is claimed is:

1. A semiconductor device comprising:
   a first-conductivity-type semiconductor substrate;
   a first-conductivity-type first semiconductor layer formed on one surface of the semiconductor substrate, the first semiconductor layer having an impurity concentration lower than that of the semiconductor substrate;
   a second-conductivity-type second semiconductor layer formed epitaxially on the first semiconductor layer;
   a second-conductivity-type third semiconductor layer formed epitaxially on the second semiconductor layer, the third semiconductor layer having an impurity concentration higher than that of the second semiconductor layer;
   a recess formed in the third semiconductor layer and the second semiconductor layer, a corner portion of a side face and a bottom surface of the recess being located in the second semiconductor layer;
   a first electrode being in contact with the third semiconductor layer;

a second electrode connected to the first electrode while being in contact with the second semiconductor layer at the bottom surface of the recess; and a third electrode being in contact with the other surface of the semiconductor substrate;

wherein a high-resistance region having resistance higher than that of the first semiconductor layer is provided in the second semiconductor layer including the corner portion.

2. The device according to claim 1, wherein the first electrode is in ohmic contact with the third semiconductor layer, the second electrode in Schottky contact with the second semiconductor layer, and the third electrode is in ohmic contact with the semiconductor substrate.

3. The device according to claim 1, wherein a side face of the recess has a normally tapered shape.

4. The device according to claim 1, wherein the semiconductor substrate and the first, second, and third semiconductor layers are made of silicon carbide.

5. The device according to claim 1, wherein the first-conductivity-type is an n type and the second-conductivity-type is a p type.

6. The device according to claim 5, wherein the third semiconductor layer has a thickness of 3 µm or more.

7. The device according to claim 5, wherein the third semiconductor layer has the impurity concentration of 1E18 to 1E21 atoms/cm$^3$.

8. The device according to claim 5, wherein the first semiconductor layer has the impurity concentration of 8E+14 atoms/cm$^3$ to 1E+17 atoms/cm$_3$.

9. The device according to claim 5, wherein the second semiconductor layer is higher than the first semiconductor layer in the impurity concentration by 0.5 to 1 order of magnitude.

* * * * *